United States Patent [19]

Soni et al.

[11] Patent Number: 4,688,306
[45] Date of Patent: Aug. 25, 1987

[54] METHOD OF PREPARING A PIEZOELECTRIC DEVICE

[75] Inventors: Pravin L. Soni, Union City; Nigel R. Farrar, Mountain View; Peter Turk, Hayward; Christiaan J. Rauwendaal, Los Altos, all of Calif.

[73] Assignee: Raychem Corporation, Menlo Park, Calif.

[21] Appl. No.: 907,121

[22] Filed: Sep. 11, 1986

Related U.S. Application Data

[62] Division of Ser. No. 628,359, Jul. 6, 1984, abandoned.

[51] Int. Cl.$^4$ ............................................. H01L 41/22
[52] U.S. Cl. .................................... 29/25.35; 29/827; 310/357; 310/800
[58] Field of Search ............... 29/25.35, 827; 310/800, 310/333, 330, 363–365, 357, 369

[56] References Cited

U.S. PATENT DOCUMENTS

| | | |
|---|---|---|
| 3,750,127 | 7/1973 | Ayers et al. . |
| 3,798,474 | 3/1974 | Cassand et al. . |
| 3,862,477 | 1/1975 | Ayers et al. . |
| 4,183,010 | 1/1980 | Miller . |
| 4,303,733 | 12/1981 | Bulle et al. . |
| 4,369,391 | 1/1983 | Micheron . |
| 4,378,721 | 4/1983 | Kaneko et al. . |

FOREIGN PATENT DOCUMENTS

| | | |
|---|---|---|
| 0089770 | 9/1983 | European Pat. Off. . |
| 7636583 | 9/1974 | Japan . |
| 757082 | 1/1975 | Japan . |
| 56-66081 | 6/1981 | Japan . |
| 2012519 | 12/1955 | United Kingdom . |
| 1358168 | 10/1970 | United Kingdom . |
| 807019 | 7/1979 | United Kingdom . |
| 2055018 | 1/1980 | United Kingdom . |
| 2042256 | 9/1980 | United Kingdom ................ 310/800 |
| 2123602 | 7/1983 | United Kingdom . |

Primary Examiner—Carl E. Hall
Attorney, Agent, or Firm—Yuan Chao; Edith A. Rice; Herbert G. Burkard

[57] ABSTRACT

A piezoelectric device comprising a first conductor, a conductive polymer member which contacts the first conductor, a piezoelectric polymer member which contacts the conductive polymer member but which is separated from the first conductor and which has been rendered piezoelectric by stretching and polarizing it while it is in contact with the conductive polymer member, and a second conductor which contacts the piezoelectric polymer member but which is separated from both the conductive polymer and the first conductor.

21 Claims, 1 Drawing Figure

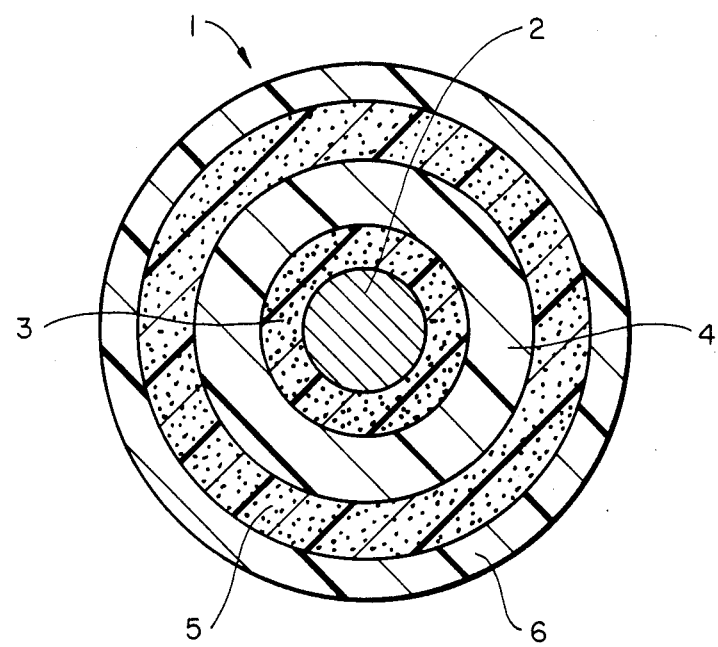
FIG_1

METHOD OF PREPARING A PIEZOELECTRIC DEVICE

This application is a division of application Ser. No. 628,359, filed Jul. 6, 1984, now abandoned.

BACKGROUND OF THE INVENTION

This invention relates to piezoelectric devices, in particular to piezoelectric coaxial cables and to a method of preparing such devices.

A number of piezoelectric devices have hitherto been proposed, generally comprising two conductors separated by a piezoelectric material. Such devices have often been proposed for use as transducers since, when they are subjected to an applied pressure, for example caused by the impact of an object, or to acoustic pressure changes, a potential difference will be generated between the conductors by the piezoelectric material. Applications for such devices are numerous and include underwater hydrophones, instrusion detectors, strain transducers, and vibration sensors. A common configuration for such devices is a coaxial cable, comprising an inner conductor, an intermediate insulating member of piezoelectric material surrounding the inner conductor, and an outer conductor surrounding the intermediate member.

In recent years certain polymeric materials for example poly(vinylidene fluoride) ($PVF_2$) and poly(vinylidene fluoride) copolymers have been suggested for use as piezoelectric materials. In order to maximize the piezoelectric properties of a vinylidene fluoride polymer, it is necessary to orient the polymer by stretching it, preferably up to its "natural" draw ratio of about 4:1 or beyond, in order to convert at least a portion of the polymer from its initial alpha or form II crystalline phase into its beta or form I crystalline phase. Simultaneously with, or subsequent to, the stretching operation, it is necessary to polarize the polymer by applying a high electric field across the polymer in a direction perpendicular to the direction of orientation in order to align the dipoles of the polymer. Electric field gradients of from 5 to 200 MV/m are typical for the polarizing operation, the maximum applied field gradient usually being determined by the dielectric breakdown strength of the polymer material. The step of polarizing the polymer is frequently referred to as "poling".

In the case of a piezoelectric coaxial cable, in order to maximize its piezoelectric response, the intermediate piezoelectric member would need to be stretched axially and polarized radially between an inner, central electrode or conductor and an outer electrode or conductor in order to convert it from an ordinary dielectric into a piezoelectric material. While the outer electrode may be applied to the intermediate layer after streching, or, if a corona poling method is employed, the cable may be passed through a corona discharge electrode and an outer conductor for the cable be subsequently provided, significant problems are encountered in the provision of an inner electrode for the cable. It is not possible to extrude the intermediate member onto a conventional metal conductor, e.g., a copper conductor, in that it would then be impossible subsequently to stretch the intermediate layer in order to convert it into the beta-phase. This problem is particularly acute when attempting to make long lengths of piezoelectric coaxial cable.

One solution is disclosed in U.K. Patent Application No. 2,055,018 (Obata et al, assigned to Kureha Kagaku Kogyo), in which a tube of piezoelectric polymer is filled with a low melting point material, for example a low melting point metal alloy. The difficulty presented by the incompatibility of ordinary metallic inner conductors with the process of stretching the piezoelectric polymer is avoided because stretching can be performed at about or above the melting point of the alloy, but still below the melting point of the piezoelectric polymer. However, such alloys are relatively brittle, especially after multiple melting-recrystallization cycles, causing piezoelectric coaxial cables made with low melting point alloy cores to be susceptible to a loss of electrical continuity due to breaks in the alloy. Furthermore, during the stretching process the alloy is molten and the piezoelectric member stretches as a free tube, resulting in a tendency to produce voids in the alloy which are undesirable because they cause poor electrical contact. Consequently, it is difficult to make long lengths of such coaxial cables.

Another solution is to prepare separately a tape of the piezoelectric polymer, stretch it, pole it, and then wrap it around the inner conductor. See, for example, U.S. Pat. No. 3,798,474 (Càssand et al., assigned to Institut Francais du Petroles, des Carburants et Lubrifiants) and U.K. Patent Application No. 2,042,256 (Quilliam, assigned to The Marconi Company). However, this process is disadvantageous in that it requires extra steps and results in poor electrical contact between the piezoelectric polymer and the inner conductor.

U.S. Pat. No. 4,303,733 to Bulle discloses filaments which are essentially coaxial cables comprising at least three layers, at least two of which are electrically conductive with at least one electrical insulating layer positioned between the two conductive layers. The patent discloses that the intermediate layer may be piezoelectric. It states that where the filament pursuant to the invention is to be provided with piezoelectric characteristics, the core component preferably is compressible, which is achieved either by utilizing hollow filaments or by selection of appropriate synthetic polymers, as for the example, polyolefins with low molecular weight or polyethers. The patent continues to say that a suitable form of execution consists of using as the core component, an electrically conductive, highly viscous liquid with metal and/or carbon black and/or graphite particles dispersed therein. Suitable highly viscous liquids mentioned are, e.g., cis- and transpolyacetylene of relatively low molecular weight.

Therefore, it can be advantageous to have a cable in which the piezoelectric member can be applied directly onto the inner conductor, preferably by extrusion, and stretched and polarized to render it piezoelectric, which also has low resistivity electrodes, and which can be readily produced in long lengths.

SUMMARY OF THE INVENTION

According to one aspect of this invention, there is provided a piezoelectric device comprising a first conductor, a conductive polymer member which contacts the first conductor, a piezoelectric polymer member which contacts the conductive polymer member but which is separated from the first conductor and which has been rendered piezoelectric by stretching and polarizing it while it is in contact with the conductive polymer member, and a second conductor which contacts the piezoelectric polymer member but which is separated from both the conductive polymer member and the first conductor. Preferably, the device is a coaxial cable in which the first or inner conductor comprises a metal melting at or below 170° C., the conductive poymer member comprises an elastomer, preferably an acrylic or fluorinated elastomer, which has been rendered electrically conductive by filling with carbon black, and the piezoelectric polymer comprises poly(vinylidene fluoride) which has been rendered piezoelectric by stretching about 200 to 400 percent and poling at a temperature between about 50° and 85° C. and under an electric field of between about 50 and 150 MV/m for between about 0.5 and 2.5 hours.

According to another aspect of this invention, there is provided a method of preparing a piezoelectric device comprising the steps of applying a conductive polymer member to a first conductor, applying a dielectric polymer member to the conductive polymer member, stretching and polarizing the dielectric polymer member while it contacts the conductive polymer member in order to render it piezoelectric, and applying an outer conductor to the dielectric polymer member. Preferably, the conductive and dielectric polymer members are applied by extrusion or coextrusion.

BRIEF DESCRIPTION OF THE DRAWING

The FIGURE is a cross-section of a preferred piezoelectric device of this invention.

DETAILED DESCRIPTION OF THE INVENTION

This invention provides a piezoelectric device, and in particular a piezoelectric coaxial cable with a metallic first conductor, but without the aforementioned prior art limitations, thereby enabling the making of piezoelectric coaxial cables in longer lengths than heretofore achievable. It comprises a first conductor, a conductive polymer member which contacts the first conductor, a piezoelectric polymer member which contacts the conductive polymer member but which is separated from the first conductor and which has been rendered piezoelectric by stretching and polarizing it while it is in contact with the conductive polymer member, and a second conductor which contacts the piezoelectric polymer member and the first conductor. Where the device is a piezoelectric coaxial cable, we call our invention a composite core piezoelectric coaxial cable, because the first or inner conductor and the conductive polymer member jointly form the core of the cable.

The conductive polymer performs the multiple functions of providing mechanical integrity to the coaxial cable during the stretching process, thereby permitting the stretching to be performed at lower temperatures at which the conversion of the piezoelectric polymer to its beta phase is maximized, of providing electrical continuity between the piezoelectric polymer and the inner conductor, and of providing electrical continuity along the length of the cable in the event of a brittle fracture or other break in the inner conductor either during or subsequent to stretching. Since in a composite core coaxial cable the primary conductive path is via the inner conductor, where it is metallic the cable's resistivity approximates that of a metal and is much lower than that of a cable wherein the inner conductor consists of a conductive polymer alone.

FIG. 1 depicts in cross-section a preferred embodiment of this invention. In FIG. 1, a composite core coaxial cable 1 includes a metallic inner conductor 2. A conductive polymer member 3 is extruded over the inner conductor 2. A piezoelectric polymer member 3 is extruded onto conductive polymer member 3 either subsequently or simultaneous by coextrusion, said member 3 having been rendered piezoelectric by stretching and poling after extrusion. An outer conductor 5 surrounds the piezoelectric polymer member 4 and an outer insulating jacket 6 surrounds outer conductor 5.

As used herein, the term "conductor" as in, for example, "first conductor", is used to mean a material that is electrically conducting. It may comprise a metallic element, a metallic alloy, or a polymeric material. As used herein, the term "metal" means a metallic alloy or element.

Preferably the conductor comprises a metal. More preferably the first or inner conductor comprises a low melting point metal (LMPM) so that the inner conductor and the conductive and piezoelectric polymer members can be heated to melt the metal and then stretched while the metal is still liquid. In theory any metal having a melting point that is sufficiently low to allow the metal to melt without thermally degrading the conductive and piezoelectric polymer members may be used, although, because the modulus of such metals in general increases with their melting point, it is desirable to select a metal having as high a melting point as possible having regard to the softening point of the conductive and piezoelectric polymer layers and having regard to the preferred stretching temperature. Preferably the metal has a melting point of not more than about 170° C., more preferably not more than about 160° C., and especially not more than about 150° C. Also it is preferred for the metal to have a melting point of at least about 50° C., more preferably about 60° C., especially at least about 65° C. and most especially at least about 70° C. The metal forming the inner conductor may be formed from an alloy having an eutectic composition in which case it will exhibit a single, well defined, melting point, or it may be formed from a non-eutectic composition in which case the metal may enter a phase between the solidus and liquidus lines of its phase diagram in which its ductility increases with temperature. It is not necessary for the metal to melt completely for the stretching operation, provided that it becomes sufficiently ductile so that it will not fracture.

In some instances, where it is possible to employ metals having melting points below 100° C., it may be desirable to use bismuth containing alloys that expand as they solidify from the melt.

The term "conductive polymer" is used to mean a polymeric composition which has been rendered electrically conductive by filling a polymer or polymer blend with an electrically conductive filler such as carbon black, graphite powder, metal particules such as nickel powder, and carbon, graphite or metal fibers. Carbon black is an especially preferred filler and is preferably used in amount ranging from 5 to 50 weight percent. The conductive polymer must not degrade at the piezoelectric polymer stretching temperature, which may be as high as about 170° C., nor should it soften or melt below about 60° C. The conductive polymer must stretch along with the piezoelectric polymer, which means that it must have an elongation of at least about 200 to 400 percent under the stretching conditions. In order to provide maximum electrical contact and minimize voiding, it must bond well to the piezoelectric polymer and the LMPM. Furthermore, low resistivity after stretching is important. For conductive polymers derived from an elastomeric material, this means a resistivity of below about 500 ohm-cm after stretching 200 to 400 percent. Preferably, the conductive polymer should have a lower modulus and a higher elongation than the piezoelectric polymer.

Polymers suitable for making the conductive polymer include homopolymers and copolymers of ethylene, acrylic acid, acrylic acid esters (especially the ethyl and methyl esters), methacrylic acid, methacrylic acid esters (especially the ethyl and methyl esters), acrylonitrile, vinyl acetate, vinyl fluoride, vinyl chloride, vinylidene fluoride, vinylidene chloride, hexafluoropropylene, trifluoroethylene, chlorotrifluoroethylene, and tetrafluoroethylene. Particularly preferred among these are polymers compatible with $PVF_2$: $PVF_2$, poly(ethylene-co-ethyl acrylate), poly(ethylene-co-acrylic acid), elastomeric hexafluoropropylene copolymers such as Viton, a fluoroelastomer commercially available from Du Pont, and acrylic ester elastomers such as Vamac, also commercially available from Du Pont. By compatible, it is meant that the polymer bonds to $PVF_2$ strongly enough so that substantial interfacial contact is maintained even after a stretching process, typically at about 100° C. and for 200 to 400 percent. Fluorinated and acrylic elastomers require greater loadings of the conductive filler to become electrically conductive, but, in compensation, have greater elongation when loaded and retain their conductivity better upon stretching.

The piezoelectric member may be formed from any material that can be rendered piezoelectric by orientation and polarization. Such materials include poly(ethylene terphthalate), nylon 5, nylon 7, poly(hydroxybutyrate), poly(acrylonitrile-co-vinyl acetate), and vinylidene fluoride polymers. The term "vinylidene fluoride polymer" is intended to include poly(vinylidene fluoride), commonly abbreviated to "PVDF" or "$PVF_2$" and those copolymers of vinylidene fluoride which can be rendered piezoelectric by orientation and polarization. Suitable copolymers include copolymers and terpolymers of vinylidene fluoride with vinyl fluoride, trifluoroethylene, tetrafluoroethylene, vinyl chloride, and chlorotrifluoroethylene. In addition, blends of vinylidene fluoride polymers with other polymers, e.g., poly(methyl methacrylate), are included provided that the piezoelectric activity itself is not destroyed. Composites made from vinylidene fluoride polymers and filled vinylidene fluoride polymers may also be used. Preferably the piezoelectric member comprises a vinylidene fluoride polymer, more preferably poly(vinylidene fluoride) and especially it consists substantially solely of poly(vinylidene fluoride).

In this specification, where a polymer is said to be rendered piezoelectric by stretching and polarizing it, it is not meant that the polymer is perforce devoid of any piezoelectric activity without the completion of both steps, but that piezoelectric activity, if absent before completion, is generated in it or, if present before completion, is substantially enhanced in it by the performance of these steps.

Possible configurations and materials for the outer conductor are diverse, subject to the requirements that it establishes and maintains good electrical contact with the piezoelectric polymer and that it is not susceptible to breaks interrupting its electrical continuity. Conductive polymer outer conductors, despite their higher resistivity, are sometimes desirable becaue they are easy to apply, for example, by extrusion or coextrusion. For certain applications they may even be the conductor of choice. Generally, metallic outer conductors are preferred because of their low resistivity. Preferably the metallic conductor is applied directly to the surface of the piezoelectric polymer by, for example, coating it with a conductive paint. Conductive paints comprising a suspension of metal particles, in particular silver particles, dispersed in a liquid vehicle can be employed. The paint can be applied by spraying, brushing, dipping, coating, or the like. Another technique for attaching the outer conductor is to vacuum deposit a layer of highly conductive metal, e.g. silver, onto the surface.

Optionally, a composite core piezoelectric coaxial cable of this invention may be protected by an outer insulating jacket which may be made from any material which is a good electrical insulator and which provides the desired degree of mechanical protection. For example, polyethylene, vulcanized rubber, or poly(vinyl chloride) are commonly used. Poly(vinyl chloride) is particularly preferred.

In another aspect of this invention, additional layers of the piezoelectric member, separated from each other by an intervening conductive polymer layer, may be added over the outer conductor, thereby increasing the piezoelectric response. An example of such a construction is a composite core coaxial cable comprising an LMPM inner electrode surrounded sequentially by a first conductive polymer, a first piezoelectric polymer, a second conductive polymer member which may be the same or different from the first, a second piezoelectric polymer member which may be the same or different from the first, and so forth, and finally an outermost conductor which may be either a metal or a conductive polymer.

As used herein, the term "coaxial cable" is not intended to imply that the inner and outer conductors must be exactly concentric, but rather it is intended to mean that the inner conductor is surrounded by, and insulated from, the outer conductor by the conductive and piezoelectric polymer members. It will be appreciated by those skilled in the art that some deviation from absolute concentricity is the rule in coaxial cables, and in some cases this may be intended.

Where the piezoelectric polymer is $PVF_2$, it should be stretched and polarized in a strong electric field before significant piezoelectric responsiveness develops. Stretching partially or substantially converts $PVF_2$ from the alpha-phase in which it ordinarily crystallizes from the melt into oriented chains of the more highly polar beta-phase. The stretching temperature is important. The temperature should be high enough so that there is sufficient molecular mobility for individual polymer segments to realign themselves without fracture, but not so high (above about 150° C.) so that entire alpha-phase chains are mobile enough to slide past each other instead of stretching to the beta-phase conformation, thus resulting in little conversion, and is preferably between about 60° to 100° C. Furthermore, the melting point of the LMPM should be taken into account, and stretching is preferably done at a temperature range from about 10° C. below the LMPM melting point to about 20° C. above. The amount of stretching should be about 200 to 400 percent.

If desired, $PVF_2$ may be crosslinked, for example by gamma or electron beam irradiation, and stretched at a temperature above its melting point by the method described in application Ser. No. 603,535 of Soni et al., the disclosure of which is incorporated herein by reference.

The poling process converts the randomly oriented dipoles of the beta-phase into uniformly oriented ones. For poling PVF$_2$, electric fields of 5 to 200 MV/m can be used, but fields of 50 to 150 MV/m are preferred, and about 100 MV/m most preferred. The poling may be done by a contact method, in which case the outer electrode should be provided before the poling. A high voltage connection is made directly to the outer electrode while the inner electrode is connected to the ground, or vice versa. The device is heated to a temperature above the alpha-transition temperature in order to maximize molecular mobility and poled at temperature for about 0.5 to 2.5 hours, and preferably 1 hour. A poling temperature in the range from about 60° to 85° C. is preferred and about 80° C. most prefered. At the end of this period, the device is cooled while maintaining the voltage in order to freeze in the dipole orientation.

PVF$_2$ can also be poled by a corona discharge, in which case the outer electrode must be provided after the poling. The device is passed through a tubular corona discharge electrode with the inner conductor of the device grounded. Preferred poling times are from a few minutes to half an hour. While corona poling may be performed at temperatures other than room temperature, it is often done at room temperature because temperature control is sometimes inconvenient.

While in this specification we have primarily described the process of rendering PVF$_2$ piezoelectric as "stretching and poling", this phrase does not mean that it is essential for the stretching operation to be completed prior to poling, but merely that this is a common and convenient sequence in the product of the device of this invention. In fact, stretching and poling may be performed simultaneously without any adverse effects on the piezoelectric properties thus generated or enhanced and, where the circumstances are appropriate, may even be preferable because of a reduction in the number of manufacturing steps required. Simultaneous stretching and poling can be accomplished, for example, by passing the PVF$_2$ or device made therefrom between electrically charged calender rolls or through a circular or cylindrical corona discharge electrode while being stretched.

The conductive and piezoelectric polymer members may both be applied by extrusion. Although the conductive polymer can be extruded first, followed by the piezoelectric polymer in a second, separate extrusion, it is preferable to employ a coextrusion process in which both polymers are applied in a single extrusion because of the savings in the number of steps and time required and because better bonding of the polymer layers results.

In either an extrusion or coextrusion process, the LMPM may be fed into the die in wire form. However, it is difficult to obtain high quality, long lengths of LMPM wire, so this procedure often results in short production runs. In an improved procedure, the LMPM is melted and fed, for example by gravity, into a zenith melt gear pump which in turn pumps the molten LMPM into the extruder die and the conductive polymer is immediately extruded over it. Alternatively, the molten LMPM can be gravity fed directly into the extruder die. By either of these procedures, long lengths of coaxial cable can be extruded without being limited by the availability of long lengths of high quality LMPM wire.

The hydrostatic coefficient d3h is a convenient measure for estimating the piezoelectric activity of a sample. This coefficient is typically measured by placing the sample in a cyclical pressure cell, with the cyclical hydrostatic pressure being applied by a piston displacing a dielectric oil. Typical peak-to-peak pressures used during an experiment are approximately 140–1000 kPa (20–140 psi) with a frequency of −3 to 10 Hz. The pressure is measured via a Sensotec A205 transducer and 540D amplifier (accuracy approximately 9 kPa). Signals from both devices are fed into a Nicolet 2090 III digital oscilloscope from which peak-to-peak pressures P and charge Q can readily be determined. The hydrostatic coefficient d3h can then be determined as $$d3h = Q/AP$$

where A is the sample surface area. For a coaxial cable construction, A is given by $$A = 2\pi \epsilon \epsilon_1 t / \ln(R/R')$$

where l is the length, t is the thickness, $\epsilon$ is the relative permittivity of the piezoelectric layer, $\epsilon$ is the permittivity of free space, R is the outer radius, and R' is the inner radius. A common unit for d3h is pC/N (picoCoulombs/Newton). The pyroelectric effect produced in such an experiment is not corrected for, as it amounts to only about 5% of the measured activities. Such a correction, if made, would result in an increase of the reported d3h.

The following examples are provided by way of illustration and not of limitation.

EXAMPLE 1

A conductive polymer formulation with a resistivity of 12 ohm-cm was prepared by milling an acrylic elastomer (Vamac B-124, Du Pont) with 16.0 weight per cent carbon black (Black Pearls 2000, Cabot). It was then extruded over wire made of an alloy containing bismuth (52.5%), lead (32.0%), and tin (15.5%) and melting at 95° C. (Belmont Metals 2531). A 1.5 in. extruder operating at 7.5 rpm screw speed, 4500–5000 psi head pressure, and 65° C. (zone 1) to 125° C. (die) temperature profile was used. The tooling parameters were: die, 0.165 in. ID; tip, 0.100 in. ID and 0.125 in. OD.

Poly(vinylidene fluoride) (Solef 1008, Solvay) was then extruded over this construction using the same extruder but operating at 20–25 rpm screw speed, 700 psi head pressure, and 210° C. (zone 1) to 232° C. (die) temperature profile. The tooling parameters were: die, 0.320 in. ID; tip, 0.170 in. ID and 0.220 in. OD.

A segment of this alloy-conductive polymer-PVF$_2$ combination was stretched at 100° C. on an Instron mechanical tester equipped with a hot box at a rate of 2 in/min. to approximately its natural draw ratio, or about 300 percent.

The stretched combination was coated with conductive silver paint and then poled at 65° C. for 1 hour by the contact method. The applied voltage was 35 kV, corresponding to a field of 116 MV/m on allowance for sample thickness. Its hydrostatic coefficient d3h after poling was 12.9 pC/N.

EXAMPLE 2

Example 1 was repeated, except that the poling was done at 80° C. for 0.5 hour at 35 kV. Two samples were poled, corresponding to fields of 109 MV/m and 113 MV/m on allowance for sample thickness. The d3h's were 9.2 and 10.2 pC/N, respectively.

EXAMPLE 3

A conductive polymer formulation with a resistivity of 7 ohm-cm was prepared by mixing in a Banbury mixer an acrylic elastomer (Vamac B-124) with 17.5 weight per cent carbon black (Black Pearls 2000, Cabot). It and a layer of $PVF_2$ (Solef 1008) were coextruded over the same alloy as in Example 1 (Belmont Metals 2531), with the $PVF_2$ forming the outermost layer. The alloy was fed as a melt using a zenith gear pump operating at 115° C. and 6 rpm. The $PVF_2$ extruder was a 1 in. extruder operating at 30 rpm, 700 psi, and 170° C. (zone 1) to 210° C. (die). The conductive polymer extruder was a 1.25 in. extruder operaitng at 10 rpm, 1000 to 3000 psi, and 65° C. (zone 1) to 140° C. (die). The tooling parameters were: die, 0.215 in. ID; first tip, 0.150 in. OD; second tip, 0.0825 in. OD.

A segment of this coextruded combination was stretched under the conditions described for Example 1 and then coated with conductive silver paint.

A sample poled at 80° C. for 1 hr at 25 kV (54 MV/m) by the contact method had a d3h of 10.2 pC/N. Another sample poled at 80° C. for 0.5 hr at 45 kV (134 MV/m) also by the contact method had an activity of 13.1 pC/N.

We have described our invention primarily in terms of a composite core coaxial cable, but its improvement over the prior art is generally applicable to piezoelectric devices comprising a first conductor, a conductive polymer member which contacts the first conductor, a piezoelectric polymer member which contacts the conductive polymer member but which is separated from the first conductor and which has been rendered piezoelectric by stretching and polarizing it while it is in contact with the conductive polymer member, and a second conductor which contacts the piezoelectric polymer member but which is separated from both the conductive polymer member and the first conductor.

While the invention has been described herein in accordance with certain preferred embodiments thereof, many modifications and changes will be apparent to those skilled in the art. Accordingly, it is intended by the appended claims to cover all such modifications and changes as fall within the true spirit and scope of the invention.

We claim:

1. A method of preparing a piezoelectric device comprising
   (a) providing a metallic first conductor having a melting point in the range between about 50° C. and about 170° C.
   (b) applying a conductive polymer member to the first conductor such that the first conductor and the conductive polymer member are in contact,
   (c) applying a dielectric polymer member which is capable of being rendered piezoelectric to the conductive polymer member such that the conductive polymer member and the dielectric polymer member are in contact,
   (d) heating the first conductor, the conductive polymer member, and the dielectric polymer member to a temperature above the melting point of the first conductor, whereby the first conductor becomes molten,
   (e) stretching the dielectric polymer member while the first conductor is molten,
   (f) polarizing the dielectric polymer member while it contacts the conductive polymer member to render the dielectric polymer member piezoelectric, and
   (g) applying an outer conductor to the dielectric polymer member.

2. A method according to claim 1 wherein the first conductor comprises a metal melting at or below 150° C.

3. A method according to claim 1 wherein the first conductor is molten when the conductive polymer member is applied.

4. A method according to claim 1 wherein the dielectric polymer member is applied by extrusion.

5. A method according to claim 1 wherein the conductive polymer and the dielectric polymer members are simultaneously applied by coextrusion.

6. A method according to claim 1 wherein the conductive polymer member has a resistivity below about 500 ohm-cm.

7. A method according to claim 1 wherein the conductive polymer member comprises an acrylic elastomer.

8. A method according to claim 1 wherein the conductive polymer member comprises a fluorinated elastomer.

9. A method according to claim 1 wherein the piezoelectric polymer member comprises a vinylidene fluoride polymer.

10. A method according to claim 1 wherein the piezoelectric polymer member comprises vinylidene fluoride homopolymer.

11. A method according to claim 1 wherein the dielectric polymer member is stretched by 200 to 400 percent.

12. A method according to claim 1 wherein the dielectric polymer member is polarized in an electric field in the range of 50 to 150 MV/m.

13. A method according to claim 1 wherein the second conductor comprises a metal.

14. A method according to claim 1 further comprising applying an electrically insulating jacket to the second conductor.

15. A method of preparing a coaxial cable comprising
   (a) providing a metallic inner conductor having a melting point in the range between about 50° C. and about 170° C.,
   (b) extruding a conductive polymer member over the inner conductor,
   (c) extruding a dielectric polymer member which is capable of being rendered piezoelectric over the conductive polymer member,
   (d) heating the inner conductor, the conductive polymer member, and the dielectric polymer member to a temperature above the melting point of the inner conductor, whereby the inner conductor becomes molten,
   (e) stretching the dielectric polymer member while the first conductor is molten,
   (f) polarizing the dielectric polymer member to render said member piezoelectric, and
   (g) applying a second metallic conductor to the dielectric polymer member.

16. A method according to claim 15 wherein the metallic inner conductor comprises a metal melting at or below 150° C.

17. A method accoring to claim 15 wherein the conductive polymer member and the dielectric polymer member are coextruded.

18. A method according to claim 15 wherein the conductive polymer member comprises an acrylic elastomer.

19. A method according to claim 15 wherein the conductive polymer member comprises a fluorinated elastomer.

20. A method according to claim 15 wherein the piezoelectric polymer member comprises a vinylidene fluoride polymer.

21. A method according to claim 15 wherein the piezoelectroc polymer member comprises vinylidene fluoride homopolymer.

* * * * *